(12) United States Patent
Ko et al.

(10) Patent No.: US 7,336,122 B2
(45) Date of Patent: Feb. 26, 2008

(54) LOW POWER HIGH SIDE CURRENT MONITOR WHICH OPERATES AT HIGH VOLTAGES AND METHOD THEREFOR

(75) Inventors: Isaac Terasuth Ko, Hong Kong (CN); Iris Ho, Hong Kong (CN)

(73) Assignee: Supertex, Inc., Sunnyvale, CA (US)

( * ) Notice: Subject to any disclaimer, the term of this patent is extended or adjusted under 35 U.S.C. 154(b) by 0 days.

(21) Appl. No.: 11/295,100

(22) Filed: Dec. 6, 2005

(65) Prior Publication Data
US 2007/0126493 A1 Jun. 7, 2007

(51) Int. Cl.
*G05F 1/10* (2006.01)
(52) U.S. Cl. ............... 327/538; 327/543; 327/108
(58) Field of Classification Search ......... 327/538, 327/543, 546, 103, 108
See application file for complete search history.

(56) References Cited

U.S. PATENT DOCUMENTS

| | | | |
|---|---|---|---|
| 5,796,278 A * | 8/1998 | Osborn et al. ............ 327/108 |
| 6,011,413 A * | 1/2000 | Hayakawa et al. ........... 327/51 |
| 6,198,315 B1 * | 3/2001 | Nakano ..................... 327/110 |
| 6,437,607 B1 * | 8/2002 | Milanesi ..................... 327/90 |
| 6,956,727 B1 * | 10/2005 | Brokaw ..................... 361/93.7 |

* cited by examiner

*Primary Examiner*—N. Drew Richards
*Assistant Examiner*—Hai L. Nguyen
(74) *Attorney, Agent, or Firm*—Jeffrey D. Moy; Weiss & Moy, P.C.

(57) ABSTRACT

A low power high side current monitor has an input terminal and a load terminal. A current sensing element is coupled to the input terminal and the load terminal. A first resistor is coupled to the input terminal. A first pair of transistors is coupled together and to the first resistor. A second pair of transistors is coupled together and to the first pair of transistors. A third pair of transistors is coupled together and to the second pair of transistors. At least one diode is coupled to the second pair of transistors and the third pair of transistors. A transistor has a first terminal coupled to the third pair of transistors and a second terminal coupled to the second pair of transistors. A second resistor is coupled to a third terminal of the transistor and to ground.

8 Claims, 3 Drawing Sheets

LOW POWER HIGH SIDE CURRENT MONITOR WHICH OPERATES AT HIGH VOLTAGES AND METHOD THEREFOR

FIELD OF THE INVENTION

The present invention relates generally to a current monitor, and more specifically to a low power high side current monitor that operates at high voltages.

BACKGROUND OF THE INVENTION

Current measurement or current monitoring devices are used to monitor the current flow into and out of electronic circuits. These types of devices have a wide range of applications. For example, these types of devices include over current protection and supervising devices in actuators and motors, programmable current sources, switch mode power supplies, and the like. In general, there is a demand for dedicated current monitors that accomplish their task with low quiescent current. This is especially true for current monitors used in high voltage applications.

Therefore, it would be desirable to provide a current monitor that overcomes the above problems. The current monitor will be a low power high side current monitor which can operate at a high voltage. The low power high side current monitor would be able to operate at a high voltage with low quiescent current.

SUMMARY OF THE INVENTION

In accordance with one embodiment of the present invention, a low power high side current monitor is disclosed. The low power high side current monitor has an input terminal and a load terminal. A current sensing element is coupled to the input terminal and the load terminal. An operational amplifier has a non-inverting input coupled to the load terminal. A first resistor is coupled to the input terminal and an inverting input of the operational amplifier. A first transistor has a first terminal coupled to the first resistor and the inverting input of the operational amplifier and a second terminal coupled to an output of the operational amplifier. A second resistor is coupled to a third terminal of the first transistor and to ground. A second transistor has a first terminal coupled to the operational amplifier, a second terminal coupled to a voltage source, and a third terminal coupled to ground.

In accordance with another embodiment of the present invention, a low power high side current monitor is disclosed. The low power high side current monitor has an input terminal and a load terminal. A current sensing element is coupled to the input terminal and the load terminal. A first resistor is coupled to the input terminal. A first pair of transistors is coupled together and to the first resistor. A second pair of transistors is coupled together and to the first pair of transistors. A third pair of transistors is coupled together and to the second pair of transistors. At least one diode is coupled to the second pair of transistors and the third pair of transistors. A transistor has a first terminal coupled to the third pair of transistors and a second terminal coupled to the second pair of transistors. A second resistor is coupled to a third terminal of the transistor and to ground.

The foregoing and other objectives, features, and advantages of the invention will be apparent from the following, more particular, description of the preferred embodiment of the invention, as illustrated in the accompanying drawings.

BRIEF DESCRIPTION OF THE DRAWINGS

The novel features believed characteristic of the invention are set forth in the appended claims. The invention itself, as well as a preferred mode of use, and advantages thereof, will best be understood by reference to the following detailed description of illustrated embodiments when read in conjunction with the accompanying drawings, wherein like reference numerals and symbols represent like elements.

DESCRIPTION OF PREFERRED EMBODIMENT

Figure 1:
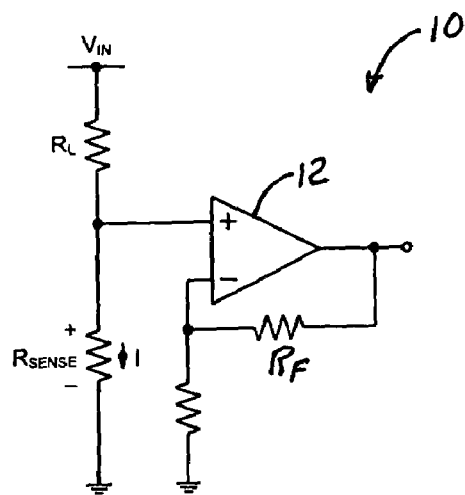
FIG. 1 is a prior art low side current monitor.

Referring to FIG. 1, a simplified prior art current monitor 10 is shown. The current monitor 10 has an operation amplifier 12. The positive input of the operation amplifier 12 is coupled to an input voltage $V_{in}$ via a resistive load $R_L$. The negative input of the operation amplifier 12 is coupled to an output of the operation amplifier 12 via a feedback resistor $R_F$. The current monitor 10 employs a low side principle since a sense resistor $R_{SENSE}$ is coupled in series with the ground path.

Figure 2:
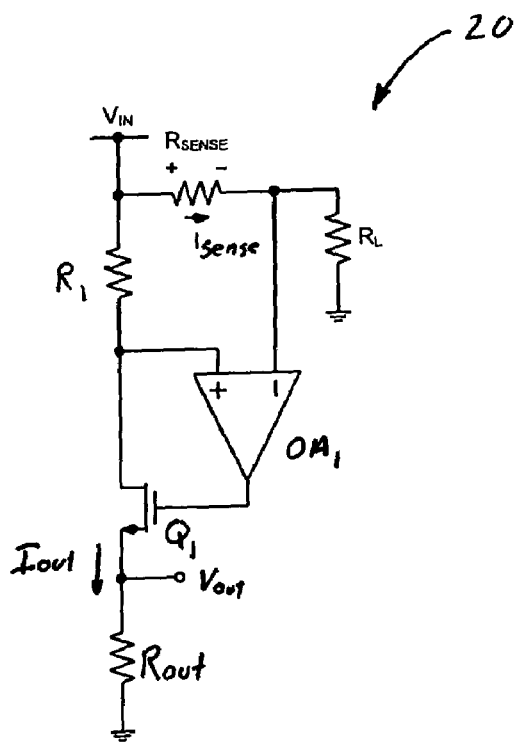
FIG. 2 is a prior art high side current monitor.

Referring now to FIG. 2, a simplified prior art current monitor 20 is shown. The current monitor 20 uses a high side principle. As seen in FIG. 2, the sense resistor $R_{SENSE}$ is coupled in series with a hot wire $V_{IN}$. Using a high side current monitor 20 eliminates the need to disrupt the ground plane when sensing a load current. High side current monitors are well suited for automotive applications in which the automobile chassis serves as the ground potential.

The sense resistor $R_{SENSE}$ is connected in series with a signal having a voltage $V_{IN}$ and carries a current I to a load $R_L$. The sense resistor $R_{SENSE}$ is typically on the order of $0.1\Omega$. An operational amplifier $OA_1$ is connected across the sense resistor $R_{SENSE}$ with its inverting input connected to the load side of the sense resistor $R_{SENSE}$, and its non-inverting input connected to the high side sense resistor $R_{SENSE}$ via a resistor $R_1$. A feedback transistor $Q_1$ is coupled to the output of the operational amplifier $OA_1$, to the resistor $R_1$ and the non-inverting input of the operational amplifier $OA_1$, and has a terminal providing an output $I_{out}$. $I_{out}$ is delivered to an output resistor $R_{out}$ to produce an output voltage $V_{out}$.

In operation, $I_{sense}$ develops a shunt voltage $V_{sense}$ across the resistor $R_{SENSE}$. The operational amplifier $OA_1$ responds by causing the transistor $Q_1$ to conduct a current through the resistor $R_{OUT}$ necessary to equalize the operational amplifier's inverting and non-inverting inputs. This current ($I_{out}$) is proportional to the voltage ($V_{sense}$) across and thus to the current ($I_{sense}$) through sense resistor $R_{SENSE}$. As output voltage $V_{out} = I_{out} R_{out}$, it is also proportional to current of interest $I_{sense}$.

When the current is sensed on the high side of the current monitor 20, the differential voltage applied to the operational amplifier $OA_1$ can have a large common mode potential. An operational amplifier IC has an associated breakdown voltage determined by its fabrication process, which limits its common mode input range—which in turn limits the signals with which the current monitor 20 can be safely used.

Figure 3:
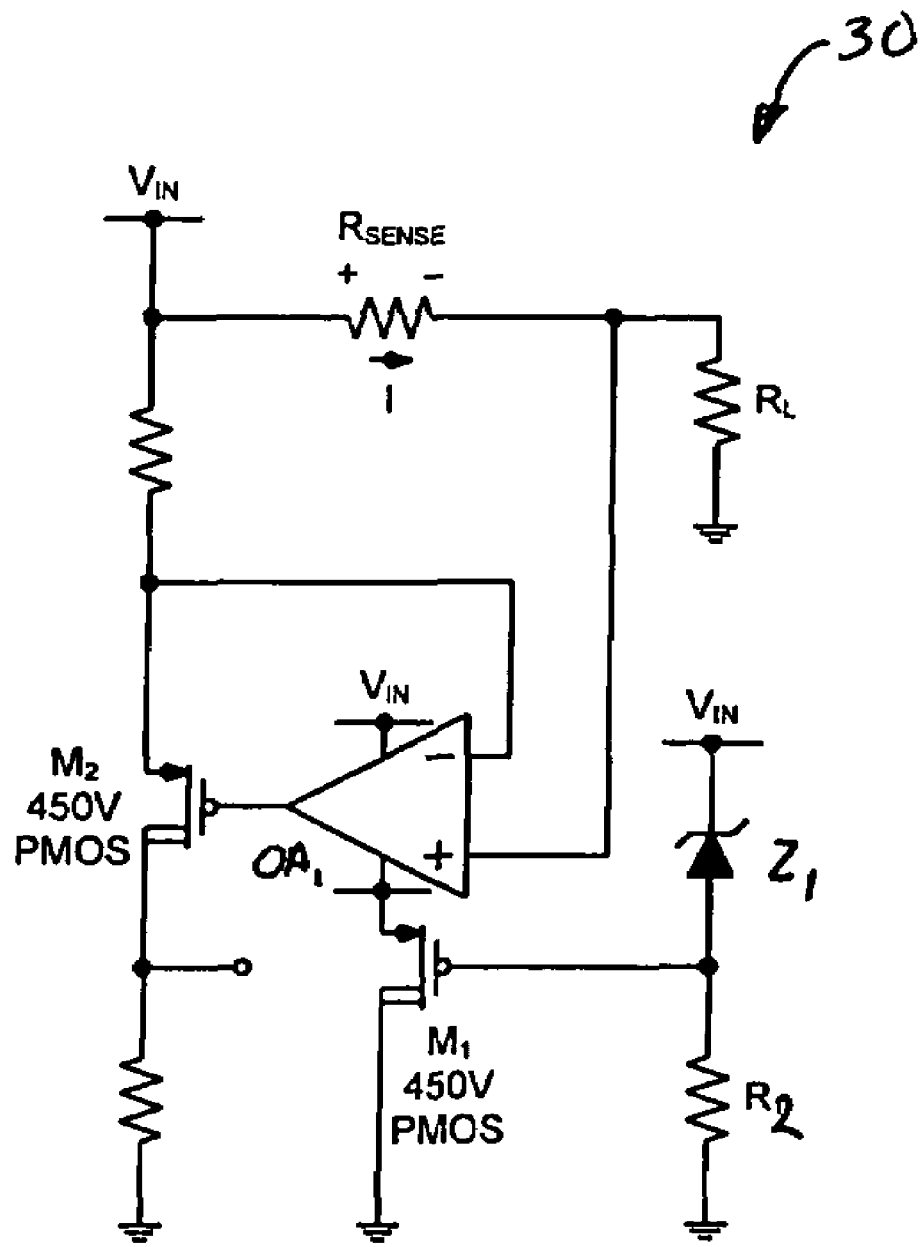
FIG. 3 is a prior art high side current monitor which can operate at a high voltage.

Referring to FIG. 3, another high side current monitor 30 is shown. The high side current monitor 30 is a modification of the high side current monitor 20 for use at any voltage level, subject to limitations of the high voltage PMOS transistors $M_1$ and $M_2$.

In the high side current monitor 30, it must be ensured that the maximum rating of the operational amplifier $OA_1$ is not violated. For this purpose, a Zener diode $Z_1$ limits the supply voltage to 8V minus the $V_{GS}$ of the transistor $M_1$ or 7V. The current of the Zener diode $Z_1$ of the high side current monitor 30 needs to be at least several hundred microamperes. It should be noted that the di/dt slope of the Zener diode $Z_1$ goes negative at low current. This condition may introduce noise or even oscillation in the high side current monitor 30. The minimum specified bias sets the maximum value of the resistor $R_2$. Thus, for supply voltages of 10 to 450V, the resistor $R_2$ cannot be larger than 20 k$\Omega$, which results in more than 8 W power dissipation at 450V.

One can accommodate designs with lower or higher operating voltages by properly selecting value of the resistor $R_2$. However, this is only possible when the resistor $R_2$ is not integrated with other circuitry on a single chip.

Figure 4:
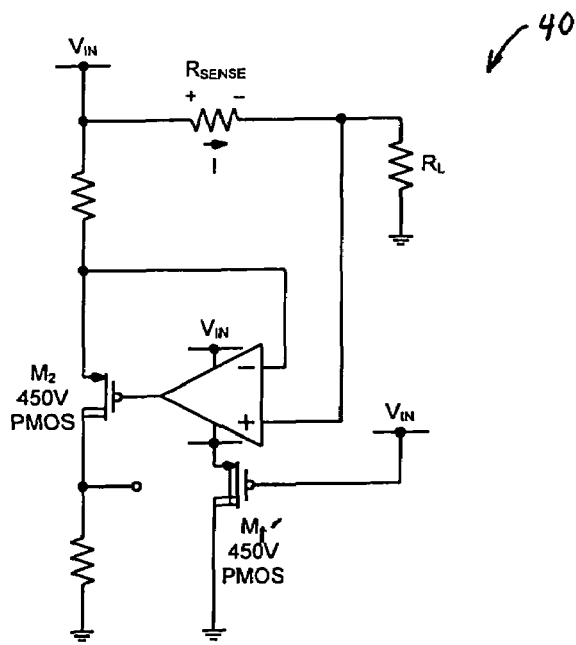
FIG. 4 is a simplified block diagram of the high side current monitor of the present invention.

Referring to FIG. 4, a high side current monitor 40 is shown. The high side current monitor 40 is similar to the high side current monitor 30 shown in FIG. 3. However, in order to obtain a low power but fully integrated solution, the shunt regulator formed by the resistor $R_2$, transistor $M_1$ and the Zener diode $Z_1$ in FIG. 3 needs to be replaced with a single depletion mode PMOS transistor $M_1'$. This will allow the high side current monitor 40 to operate at voltage levels from 10V to 450V without power dissipation by the shunt regulator.

Figure 5:
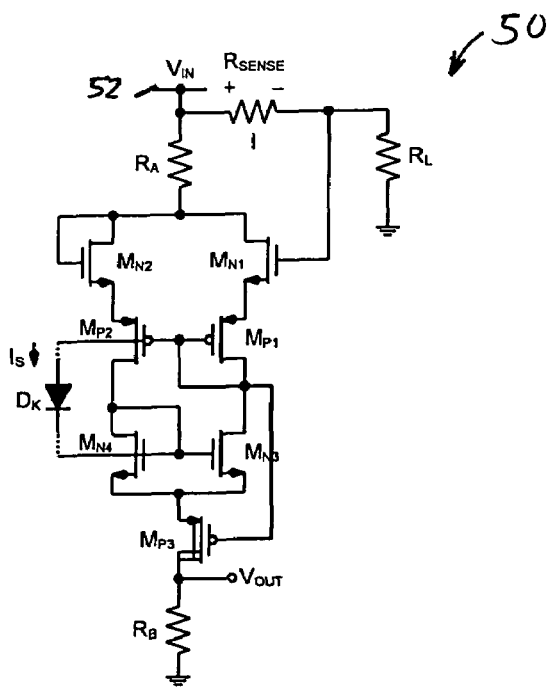
FIG. 5 is a schematic diagram of the high side current monitor of the present invention.

Referring to FIG. 5, another embodiment of the present invention is shown. The high side current monitor 50 can operate at high voltages. The high side current monitor 50 can further give an output which is proportional to the voltage across the resistor $R_{sense}$.

In this embodiment, the high side current monitor 50 has an input terminal 52. A sense resistor $R_{SENSE}$ is connected in series with the input terminal. An input signal having a voltage $V_{IN}$ carries a current I to a load terminal having a load $R_L$. Another resistive element $R_A$ has a first terminal coupled to the input terminal 52 and the sense resistor $R_{SENSE}$.

The high side current monitor 50 uses a plurality of transistor pairs. The transistor pairs have respectively matched characteristics. A second terminal of the resistive element $R_A$ is coupled to a first pair of transistors $M_{N1}$ and $M_{N2}$. In the embodiment depicted in FIG. 5, the first pair of transistors $M_{N1}$ and $M_{N2}$ are both N-channel transistors having drain, gate and source terminals. The drain terminals of both $M_{N1}$ and $M_{N2}$ are coupled to the resistive element $R_A$. The gate terminal of transistor $M_{N1}$ is coupled to both the sense resistor $R_{SENSE}$ and to the load $R_L$. The gate terminal of transistor $M_{N2}$ is coupled to the drain terminal of the drain terminal of transistor $M_{N2}$. The source terminals of transistors $M_{N1}$ and $M_{N2}$ are both coupled to a second pair of transistors $M_{P1}$ and $M_{P2}$. The drain coupling configuration for transistors $M_{N1}$ and $M_{N2}$ ensures that both transistors $M_{N1}$ and $M_{N2}$ operate at the same drain-gate voltage irrespective of the voltage across the sense resistor $R_{SENSE}$. This virtually eliminates errors resulting from channel length modulation effects in transistors $M_{N1}$ and $M_{N2}$.

The source terminal of each transistor $M_{N1}$ and $M_{N2}$ are coupled to a source terminal of transistor $M_{P1}$ and $M_{P2}$ respectively. Gate terminals of the transistors $M_{P1}$ and $M_{P2}$ are coupled together. The drain terminals of transistors $M_{P1}$ and $M_{P2}$ are both coupled to a third pair of transistors $M_{N3}$ and $M_{N4}$. The drain terminal of each transistor $M_{P1}$ and $M_{P2}$ are coupled to the drain terminals of transistor $M_{N3}$ and $M_{N4}$ respectively. The drain terminal of transistor $M_{N4}$ is coupled to the gate terminal of transistor $M_{N4}$. The gate terminal of transistor $M_{N4}$ is also coupled to the gate terminal of transistor $M_{N3}$. The source terminals of transistors $M_{N3}$ and $M_{N4}$ are coupled together and to the source terminal of a transistor $M_{P3}$. The gate terminal of transistor $M_{P3}$ is coupled to the gate terminals of $M_{P1}$ and $M_{P2}$. The drain terminal of transistor $M_{P3}$ is coupled to a resistor $R_B$.

The high side current monitor 50 has a diode chain 52. The diode chain 52 comprises one or more diodes $D_K$. The one or more diodes $D_K$ are coupled in series with one another. The diode chain 52 has a first end coupled to the gate terminals of the transistors $M_{P1}$ and $M_{P2}$. A second end of the diode chain 52 is coupled to the gate terminals of the transistors $M_{N3}$ and $M_{N4}$.

In operation at power-up, a diode leakage current $I_S$ flows through the diode $D_K$ from the drain of $M_{P1}$ into the drain of $M_{N4}$ forcing both transistors into conduction. The current flows in the drain of $M_{P1}$ and $M_{N4}$ forcing the drain voltages to be close enough for the diode $D_K$ to be biased in very low voltage and the start-up circuit is electrically isolated from the high side current monitor 50.

The self-biased nature of the drain coupled high side current monitor 50 has the advantages of fast response and zero quiescent current. The high side current monitor 50 is further a low cost fully integrated solution for high side current sensing.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A low power high side current monitor comprising:
   an input terminal;
   a load terminal;
   a current sensing element coupled to the input terminal and the load side terminal;
   an operational amplifier having a non-inverting input coupled to the load terminal;
   a first resistor coupled to the input terminal and an inverting input of the operational amplifier;
   a first transistor having a first terminal coupled to the first resistor and the inverting input of the operational amplifier and a second terminal coupled to an output of the operational amplifier;
   a second resistor coupled to a third terminal of the first transistor and to ground; and
   a second transistor having a first terminal coupled to the operational amplifier, a second terminal coupled to a voltage source, and a third terminal coupled to ground, wherein the second transistor is a single depletion mode PMOS transistor eliminating a need for a shunt regulator coupled to the operational amplifier and allowing the current monitor to operate at voltage levels from approximately 10 V to approximately 450V with minimal power dissipation.

2. A low power high side current monitor in accordance with claim 1 wherein the low power high side current monitor is formed on a single semiconductor chip.

3. A low power high side current monitor comprising:
an input terminal;
a load terminal;
a current sensing element coupled to the input terminal and the load side terminal;
an operational amplifier having a non-inverting input coupled to the load terminal;
a first resistor coupled to the input terminal and an inverting input of the operational amplifier;
a first transistor having a first terminal coupled to the first resistor and the inverting input of the operational amplifier and a second terminal coupled to an output of the operational amplifier;
a second resistor coupled to a third terminal of the first transistor and to ground; and
a second transistor having a first terminal coupled to the operational amplifier, a second terminal coupled to a voltage source, and a third terminal coupled to ground, wherein the second transistor is a single depletion mode PMOS transistor eliminating a need for a shunt regulator coupled to the operational amplifier;
wherein the low power high side current monitor is formed on a single semiconductor chip.

4. A low power high side current monitor in accordance with claim 3 wherein the single depletion mode PMOS transistor allows the current monitor to operate at voltage levels from approximately 10V to 450V with minimal power dissipation.

5. A low power high side current monitor comprising:
an input terminal;
a load terminal;
a current sensing element coupled to the input terminal and the load side terminal;
an operational amplifier having a non-inverting input coupled to the load terminal;
a first resistor coupled to the input terminal and an inverting input of the operational amplifier;
a first transistor having a first terminal coupled to the first resistor and the inverting input of the operational amplifier and a second terminal coupled to an output of the operational amplifier;
a second resistor coupled to a third terminal of the first transistor and to ground; and
a second transistor having a first terminal coupled to the operational amplifier, a second terminal coupled to a voltage source, and a third terminal coupled to ground, wherein the second transistor is a single depletion mode PMOS transistor to allow high voltage operation with minimal power dissipation;
wherein the low power high side current monitor is formed on a single semiconductor chip.

6. A low power high side current monitor in accordance with claim 5 further comprising a resistive load coupled to the load terminal.

7. A low power high side current monitor in accordance with claim 5 wherein said first transistor is a PMOS transistor.

8. A low power high side current monitor in accordance with claim 5 wherein the single depletion mode PMOS transistor allows the current monitor to operate at voltage levels from approximately 10V to 450V with minimal power dissipation.

* * * * *